United States Patent
Ishii et al.

(10) Patent No.: US 9,166,088 B2
(45) Date of Patent: Oct. 20, 2015

(54) SOLAR MODULE

(71) Applicant: Sanyo Electric Co., Ltd., Moriguchi, Osaka (JP)

(72) Inventors: Yosuke Ishii, Izumiotsu (JP); Yoshiyuki Kudo, Otsu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 102 days.

(21) Appl. No.: 14/182,583

(22) Filed: Feb. 18, 2014

(65) Prior Publication Data

US 2014/0158180 A1 Jun. 12, 2014

(30) Foreign Application Priority Data

Aug. 31, 2011 (JP) ................. 2011-189211

(51) Int. Cl.
*H01L 31/0224* (2006.01)
*H01L 31/05* (2014.01)
*H01L 31/0747* (2012.01)

(52) U.S. Cl.
CPC .... *H01L 31/0504* (2013.01); *H01L 31/022441* (2013.01); *H01L 31/0516* (2013.01); *H01L 31/0747* (2013.01); *Y02E 10/50* (2013.01)

(58) Field of Classification Search
CPC ................. H01L 31/0504; H01L 31/022441; H01L 31/0516; H01L 31/0747
USPC .......................................................... 136/256
See application file for complete search history.

(56) References Cited

U.S. PATENT DOCUMENTS

2008/0128019 A1* 6/2008 Lopatin et al. ................ 136/252
2009/0260672 A1 10/2009 Taira
2011/0094562 A1 4/2011 Funakoshi

FOREIGN PATENT DOCUMENTS

| JP | 2009-266848 A | 11/2009 |
| JP | 2010-016074 A | 1/2010 |
| JP | 2010-108994 A | 5/2010 |

* cited by examiner

*Primary Examiner* — Jayne Mershon
(74) *Attorney, Agent, or Firm* — Marvin A. Motsenbocker; Mots Law, PLLC

(57) ABSTRACT

A solar module is provided with improved photoelectric conversion efficiency. A first electrode and a second electrode (21, 22) each contain a plated film. Each plated film has a feed point (50). The feed points (50) are positioned in bus bar portions (21b, 22b). A wiring member (30) is connected electrically to the first electrode or the second electrode (21, 22) in the finger portions (21a, 22a).

5 Claims, 3 Drawing Sheets

SOLAR MODULE

CROSS-REFERENCE TO RELATED APPLICATIONS

This is a continuation of International Application PCT/JP2012/062125, with an international filing date of May 11, 2012, filed by applicant, the disclosure of which is hereby incorporated by reference in its entirety.

FIELD OF THE INVENTION

The present invention relates to a solar module.

BACKGROUND

Solar cells have attracted attention in recent years as an energy source with a low environmental impact. For example, a solar module is described in Patent Document 1 which includes a plurality of back contact solar cells connected electrically via a wiring member. The solar cells described in Patent Document 1 have a plurality of n-side electrodes and p-side electrodes arranged alternately and are electrically independent. In the first embodiment of Patent Document 1, the wiring members and solar cells are bonded using anisotropically conductive film whose base material is resin. In the second embodiment of Patent Document 1, a wiring member whose base material is a conductive material such as a thin copper plate is bonded to the central portion of a solar cell.

PRIOR ART DOCUMENTS

Patent Documents

Patent Document 1: Laid-Open Patent Publication No. 2009-266848

SUMMARY

Problem Solved by the Invention

However, when a wiring member and a solar cell are bonded using a resin adhesive, contact resistance between the wiring member and the solar cell increases, whereby the photoelectric conversion efficiency declines.

It is an object of the present invention to provide a solar module having improved photoelectric conversion efficiency.

Means of Solving the Problem

The solar module of the present invention has a plurality of solar cells, a wiring member, and a resin adhesive layer. The solar cells each have a photoelectric conversion unit, a first electrode, and a second electrode. The first electrode and the second electrode are arranged on one main surface of the photoelectric conversion unit. The wiring member electrically connects the first electrode of one solar cell to the second electrode of another solar cell adjacent to the one solar cell in one direction. The resin adhesive layer bonds a wiring member and a solar cell. The first electrode and the second electrode have a plurality of finger portions and a busbar portion. The busbar portions each extend in one direction. The busbar portion is connected electrically to the finger portions. The busbar portion is positioned in an end portion of the photoelectric conversion unit in one direction. The first electrode and the second electrode include plated film. Each plated film has a feed point. The feed point is positioned in the busbar portion. The wiring member is connected electrically to a first electrode or a second electrode in the finger portions.

Effect of the Invention

It is an object of the present invention to provide a solar module having improved photoelectric conversion efficiency.

EMBODIMENT OF THE INVENTION

Figure 1:
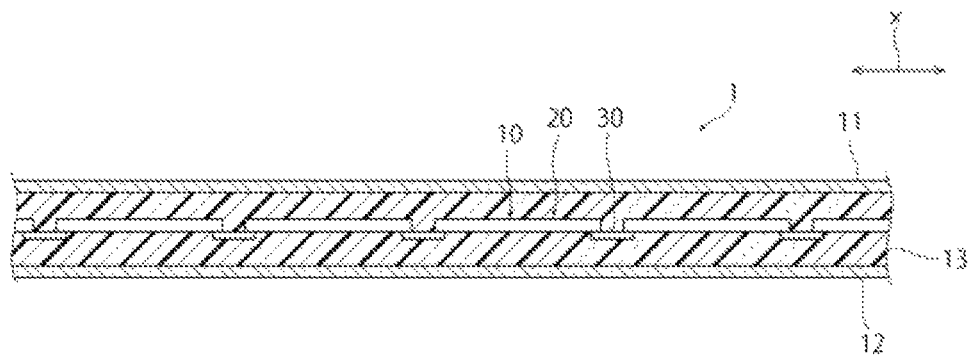
FIG. 1 is a simplified cross-sectional view of the solar module in an embodiment.

The following is an explanation of examples of preferred embodiments of the present invention. The following embodiments are merely examples. The present invention is not limited by the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

Solar Module 1

As shown in FIG. 1, the solar module 1 includes a solar cell string 10. The solar cell string 10 is arranged between a first protecting member 11 positioned on the light-receiving surface and a second protecting member 12 positioned on the back surface. A bonding layer 13 is provided between the first protecting member 11 and the second protecting member 12. The solar cell string 10 is sealed by the bonding layer 13.

The first protecting member 11 can be composed of a glass substrate or a resin substrate. The second protecting member 12 can be composed of a resin sheet, a resin sheet containing interposed metal foil, a glass plate, or a resin substrate. The bonding layer 13 can be composed of a resin such as an ethylene/vinyl acetate (EVA) copolymer, polyvinyl butyral (PVB), polyethylene (PE), or polyurethane (PU).

The solar cell string 10 includes a plurality of solar cells 20 arranged in a first direction (x-direction). The solar cells 20 are connected electrically via a wiring member 30.

Figure 2:
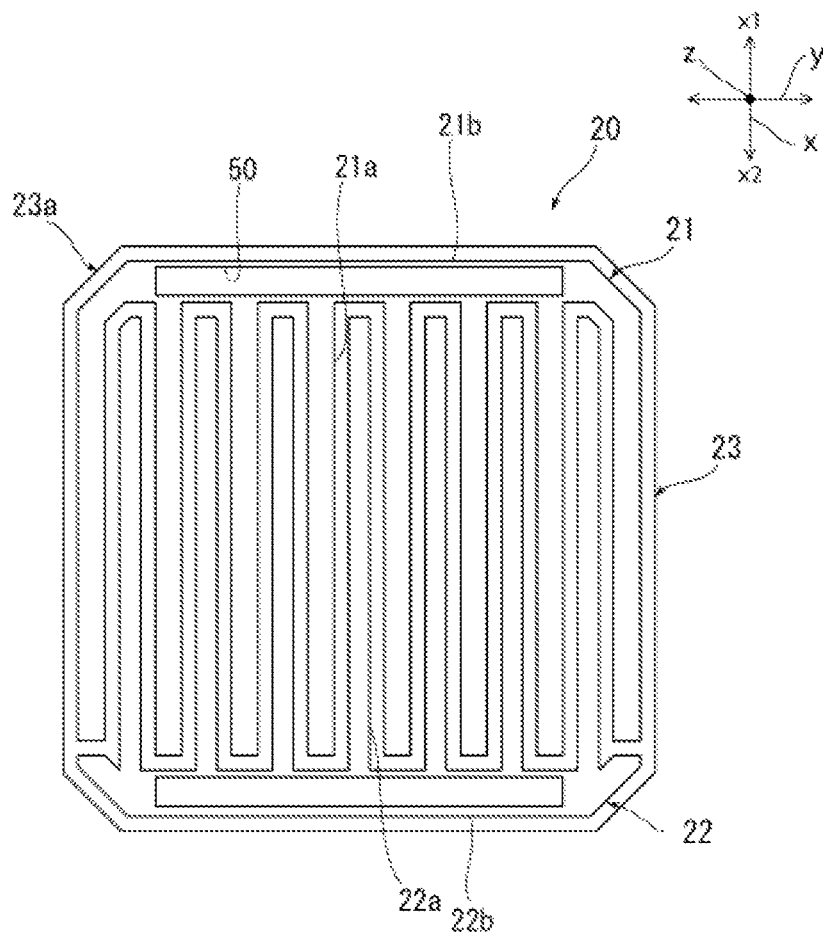
FIG. 2 is a simplified rear view of a solar cell in the embodiment.

As shown in FIG. 2, each solar cell 20 has a photoelectric conversion unit 23. The photoelectric conversion unit 23 generates carriers such as electrons or holes when exposed to light.

The photoelectric conversion unit 23 has a p-type surface and an n-type surface on one main surface (the back surface) 23*a*. The photoelectric conversion unit 23 has, for example, a semiconductor substrate having one type of conductivity, a first semiconductor layer having the other type of conductivity and arranged on a portion of the one main surface of the semiconductor substrate, and a second semiconductor layer having the one type of conductivity, and arranged on at least a portion of the one main surface of the semiconductor substrate on which the first semiconductor layer is not arranged. In this case, the surface of one of the first and second semiconductor layers is a p-type layer, and the other is an n-type layer. The semiconductor substrate is preferably an n-type single-crystal silicon substrate, and the first semiconductor layer and the second semiconductor layer are preferably made of amorphous silicon. A substantially intrinsic i-type semiconductor (i-type amorphous silicon layer) may be arranged between the semiconductor substrate and each of the first and second semiconductor layers at a thickness that does not substantially contribute to the generation of electricity such as a thickness from several Å to 250 Å.

The photoelectric conversion unit 23 may be composed of a semiconductor substrate having a p-type dopant diffusion region and an n-type dopant diffusion region on one main surface.

The first and second electrodes 21, 22 are arranged on the one main surface 23a of the photoelectric conversion unit 23. More specifically, the first electrode 21 is arranged on either the p-type surface or the n-type surface, and the second electrode 22 is arranged on the other surface. Either the first or second electrode 21, 22 arranged on the p-type surface collects holes, and the electrode arranged on the other surface collects electrons.

Each of the first and second electrodes 21, 22 is comb-shaped. Each of the first and second electrodes 21, 22 has a plurality of finger portions 21a, 22a and a busbar portion 21b, 22b. Each of the finger portions 21a, 22a extends in the first direction (x-direction). The finger portions 21a, 22a are inter-digitated in a second direction (y-direction) perpendicular to the first direction (x-direction).

The finger portions 21a are connected electrically to the busbar portion 21b. The busbar portion 21b is arranged on one side (the x1 side) of the finger portions 21a in the first direction (x direction). The busbar portion 21b is arranged on the one side of the photoelectric conversion unit 23 in the first direction (x direction) and extends one end to the other end in the second direction (y direction). The busbar portion 21b has a slender shape extending in the second direction (y direction) perpendicular to the first direction (x direction).

The finger portions 22a are connected electrically to the busbar portion 22b. The busbar portion 22b is arranged on the other side (the x2 side) of the finger portions 22a in the x direction. The busbar portion 22b is provided on the other side of the photoelectric conversion unit 23 in the first direction (x direction), and extends from one end to the other end in the second direction (y direction). The busbar portion 22b has a slender shape extending in the second direction (y direction) perpendicular to the first direction (x direction).

The first and second electrodes 21, 22 each have plated film. The plated film can be composed of a metal such as Cu or Sn or an alloy containing at least one of these metals. The thickness of the plated film can be from 2 μm to 50 μm.

The plated film can be formed using electrolytic plating. When the plated film is formed using electrolytic plating, a pole is first pressed against a conductive seed layer formed on the photoelectric conversion unit 23. The plated film is then formed by supplying power to the seed layer from the pole in a plating solution. As a result, plated film is not formed substantially in the portion where the pole makes contact, but a relatively thin plated film is formed in the other portion.

Because thin plated film is formed where the pole makes direct contact with the seed layer at the feed point 50, the plated film in the other portion forms a thin recess at the feed point 50.

The following is an explanation of an example of an embodiment in which a slender pole with a rectangular profile extending in the y direction makes contact. In the present embodiment, the feed point 50, as shown in FIG. 2 and FIG. 3, has a slender shape extending in the first direction (y direction) in which the busbar portions 21b, 22b also extend.

The surface layer of the first and second electrodes 21, 22 is composed of plated film. More specifically, the surface layers of the finger portions 21a, 22a and the busbar portions 21b, 22b of the first and second electrodes 21, 22 are composed of plated film. Even more specifically, the first and second electrodes 21, 22 are composed of a single plated film or a stacked body of several plated films.

The solar cells 20 are connected electrically via a wiring member 30. More specifically, the first electrode 21 of one solar cell 20 is connected electrically via a wiring member 30 to the second electrode 22 of another solar cell 20 adjacent to the one solar cell in the first direction (x direction).

Figure 3:
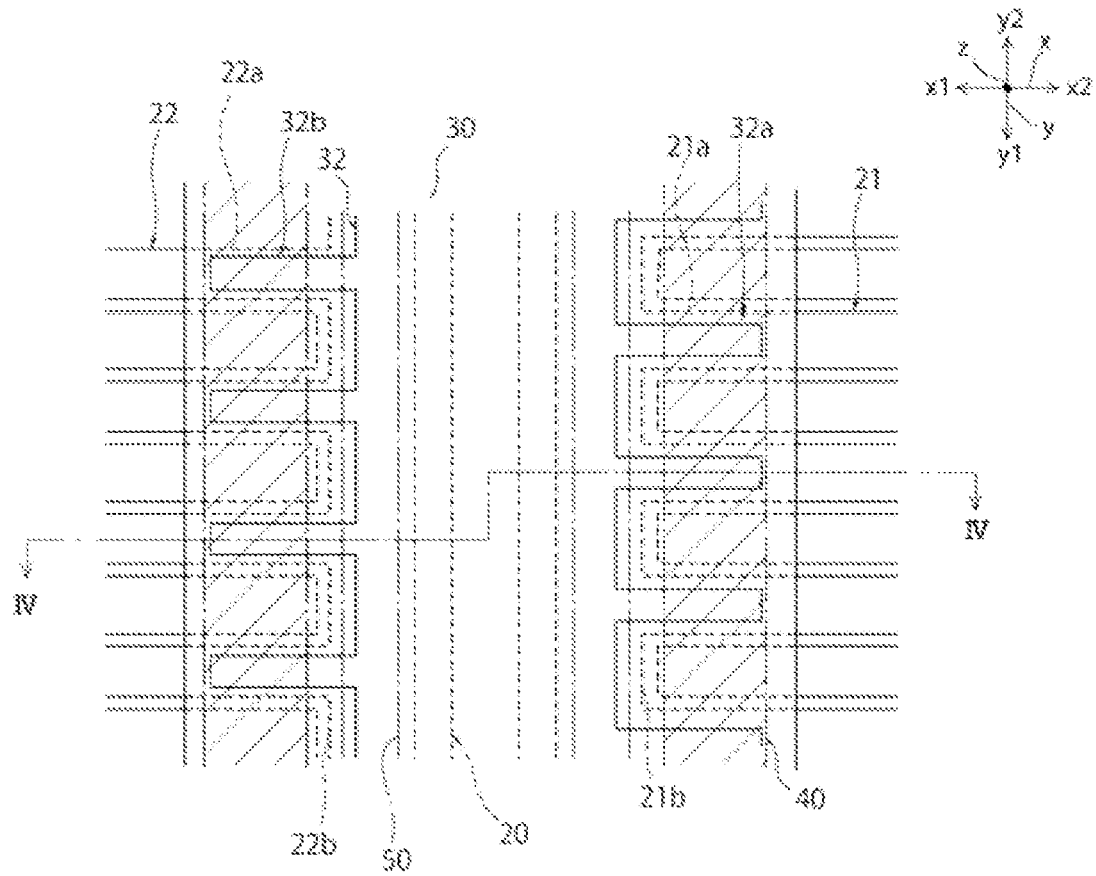
FIG. 3 is a simplified rear view of the solar cell string in the embodiment.
Figure 4:
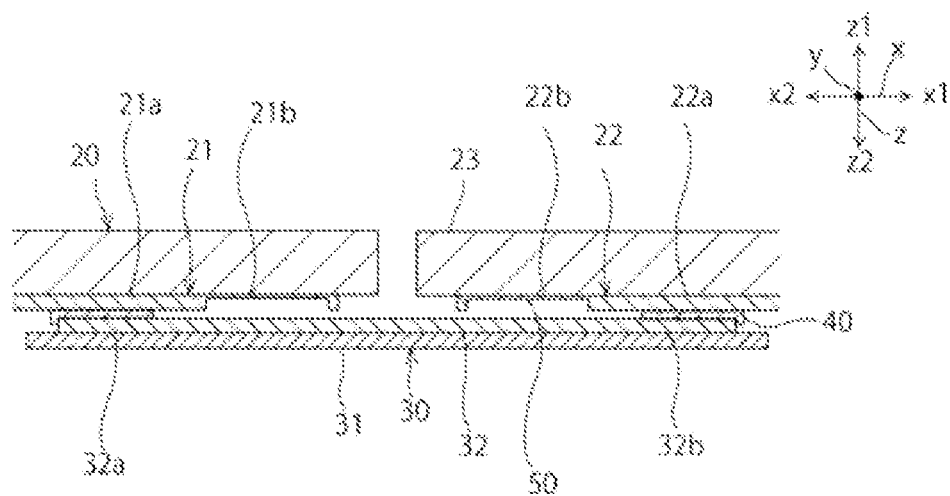
FIG. 4 is a simplified cross-sectional view from line IV-IV in FIG. 3.

The wiring member 30 and the solar cells 20 are bonded via the resin adhesive layer 40 shown in FIG. 3 and FIG. 4. The resin adhesive layer 40 can be composed of a cured resin adhesive. The resin adhesive layer 40 can also be a cured resin adhesive containing a dispersed conductive material. The resin adhesive layer 40 is not shown in cross-section in FIG. 3, but cross-hatching has been added for easy reference.

The wiring member 30 has an insulating substrate 31 and wiring 32 provided on the insulating substrate 31. The wiring 32 electrically connects the first electrode 21 of one solar cell 20 to the second electrode 22 of another solar cell 20 adjacent to the one solar cell in the first direction (x direction). In the explanation of this example, the wiring 32 is provided on the main surface of the insulating substrate 31 on the solar cell 20 side. However, some of the wiring 32 may be provided inside the insulating substrate 31. In FIG. 3, the wiring 32 is rendered not with dotted lines but with solid lines for easy reference.

The insulating substrate 31 can be composed of an insulating material such as a resin or a ceramic. The insulating substrate 31 may be flexible. In the present invention, the term "substrate" includes both sheets and film.

The wiring 32 can be composed of a metal such as Cu, Al or Ag, or an alloy containing at least one of these metals.

The wiring 32 has a first protruding portion 32a and a second protruding portion 32b. The first and second protruding portions 32a, 32b extend in the first direction (x direction) which is the direction in which the first and second finger portions 21a, 22a also extend.

At least some of the first protruding portion 32a is arranged above the finger portions 21a of the first electrode 21 of one of the solar cells 20 from among the solar cells 20 arranged adjacent to each other in the first direction (x direction). The first protruding portion 32a is connected directly to the finger portions 21a of the first electrode 21 and not via the busbar portion 21b.

At least some of the second protruding portion 32b is arranged above the finger portions 22a of the second electrode 22 of the other solar cell 20 among the solar cells 20 arranged adjacent to each other in the first direction (x direction). The second protruding portion 32b is connected directly to the finger portions 22a of the second electrode 22 and not via the busbar portion 22b.

As shown in FIG. 4, the first and second protruding portions 32a, 32b of the wiring 32 are connected electrically to the first and second electrodes 21, 22 in the finger portions 21a, 22a. More specifically, the wiring 32 is provided over the busbar portions 21b, 22b. Because of the uneven shape of the surface of the busbar portions 21b, 22b, there are areas of the busbar portions 21b, 22b in which the wiring 32 does not make contact with the busbar portions 21b, 22b. The resin adhesive layer 40 is not arranged in the area of the busbar portions 21b, 22b opposing the first and second protruding portions 32a, 32b.

In the example shown in FIG. 4, a recessed portion is formed for the entire feed point 50. Here, the pole makes contact with the entire feed point 50, and plated film is formed. Whether or not the shape has a recess depends on the conditions under which the pole makes contact with the feed point 50.

Manufacturing Method For Solar Module 1

The following is an explanation of an example of a manufacturing method for the solar module 1.

First, the solar cells 20 and wiring members 30 are prepared.

Next, two solar cells 20 and a wiring member 30 are arranged so that the first protruding portion 32a of the wiring member 30 is positioned over the finger portions 21a of the first electrode 21 of a solar cell 20, and the second protruding portion 32b of the wiring member 30 is positioned on the finger portions 22a of the second electrode 22 of the adjacent solar cell 20. Each solar cell 20 is bonded and electrically connected to the wiring member 30 in this state using a resin adhesive 40. More specifically, the wiring 32 is arranged over the busbar portions 21b, 22b. The resin adhesive layer 40 is not arranged in the area of the busbar portions 21b, 22b opposing the wiring 32.

By performing this bonding step at least once, a solar cell string 10 is created. Next, the solar cell string 10 is arranged between first and second protecting members 11, 12 and then sealed using a bonding layer 13. More specifically, an ethylene/vinyl acetate (EVA) sheet constituting the bonding layer 13 is placed on the first protecting member 11. The solar cell string 10 is placed on the EVA sheet, another EVA sheet constituting the bonding layer 13 is placed on the string, and the second protecting member 12 is placed on this sheet. These layers are laminated in a reduced-pressure atmosphere to complete the solar module 1.

However, as mentioned above, a feed point is formed where the electrodes include plated film. The feed point is arranged in the busbar portion for the optimal supply of electricity to the entire electrode. As a result, a recessed feed point is formed in the busbar portion. When the solar cells and the wiring members are bonded using a resin adhesive, either the busbar portion does not make electrical contact with the wiring in the area including the feed point, or the contact resistance between the busbar portion and the wiring member is high if electrical contact is established. As a result, the contact resistance between the wiring members and the solar cells is high, and the photoelectric conversion efficiency is lower.

Also, from the standpoint of supplying a larger current to form a plated film, the surface area of the feed point should be large. However, when the surface area of the feed point is larger, a large recess is formed.

In the solar module of the present embodiment, the wiring member 30 is connected electrically to the first and second electrodes 21, 22 in the finger portions 21a, 22a which do not include a feed point. As a result, poor electrical connections between the wiring 32 and the first and second electrodes 21, 22 due to the recessed portion of feed points 50 can be suppressed. For this reason, the solar module 1 of the present embodiment has improved photoelectric conversion efficiency. Because poor electrical connections between wiring members 32 and the first and second electrodes 21, 22 is suppressed, the reliability of the solar module 1 is also improved.

The end portion of the solar cell in which the busbar portion is arranged is subject to more stress than the inner portion in which the finger portions are arranged and is, therefore, more likely to break. In the solar module 1, the wiring member 30 and the solar cells 20 are connected in the finger portions 21a, 22a. Because the end portion of a solar cell 20 is not subject to pressure when the wiring member 30 is bonded, the solar cell 20 is less likely to break.

In the solar module 1, the protruding portions 32a, 32b of the wiring member 30 are connected to the finger portions 21a, 22a. Therefore, the protruding portions 32a, 32b and the finger portions 21a, 22a protruding from the photoelectric conversion unit are present in the area with the wiring member 30. Therefore, in the solar module 1, the solar cell 20 and the wiring member 30 are connected more securely due to the anchoring effect.

A wiring member could be connected in the area of the busbar portion with a recessed portion by using another member, but this increases manufacturing costs. In the solar module 1 of the present embodiment, any increase in manufacturing costs is held down because another member is not used.

The surface area and cost of the wiring member could be reduced by connecting the busbar portions positioned in the end portions of adjacent solar cells to each other. However, because a recessed portion is formed in the busbar portions, as mentioned above, the connection between the wiring member and the solar cells would be poor even though the wiring member could be connected to the busbar portions.

In the solar module 1 of the present embodiment, the first and second protruding portions 32a, 32b of the wiring member 30 are connected to the first and second finger portions 21a, 22a on the end with the busbar portions. This suppresses any increase in the surface area of the wiring members 30, while ensuring a connection between the wiring members 32 and the solar cells 20. In other words, any increase in the cost of the wiring members 30 can be held down while ensuring a connection between the wiring members 30 and the solar cells 20.

After the solar cells have been connected to produce a solar cell string, any solar cell found to be defective in the inspection process can be removed and replaced by a new solar cell. However, it can be difficult to remove the resin adhesive layer adhering to the solar cells. It is also difficult to connect a new wiring member to an area in which the resin adhesive layer has not been removed. In the solar module 1, a resin adhesive layer 40 is not applied to the busbar portions 21b, 22b. Therefore, when a defective solar cell 20 is replaced, the busbar portions 21b, 22b can be used to connect the new wiring 32.

Figure 5:
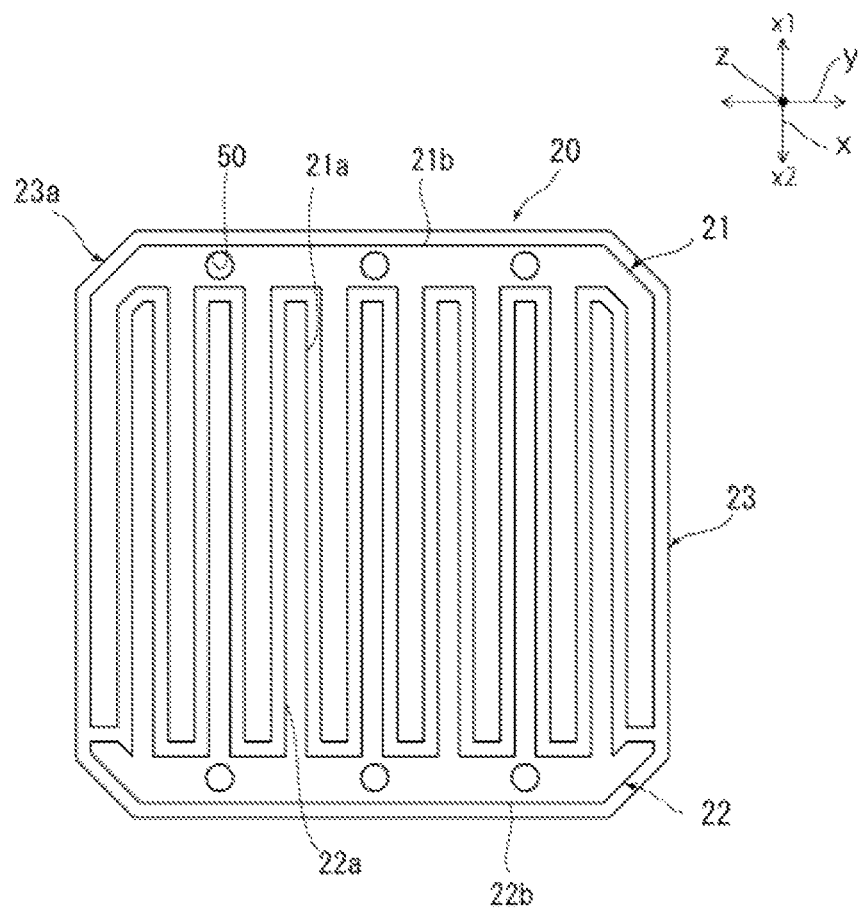
FIG. 5 is a simplified rear view of a solar cell in another embodiment.

The present invention includes many embodiments not described herein. For example, as shown in FIG. 5, a plurality of feed points 50 may be interdigitated in the first direction (x direction) in which the busbar portions 21b, 22b also extend. The shape of these feed points 50 may be circular, oval-shaped, long oval-shaped, triangular, or polygonal.

A resin adhesive layer 40 may be provided in the area of the busbar portions 21b, 22b opposing the first and second protruding portions 32a, 32b.

The first and second protruding portions 32a, 32b of the wiring 32 may be arranged so as not to span the portion of the busbar portions 21b, 22b in which a feed point 50 has been formed.

The wiring member 30 may be connected electrically to the finger portions 21a, 22a and connected electrically to the busbar portions 21b, 22b in the first or second electrode 21, 22.

The present invention includes many other embodiments not described herein. Therefore, the technical scope of the present invention is defined solely by the items of the invention specified in the claims pertinent to the above explanation.

KEY TO THE DRAWINGS

1: Solar module
20: Solar cell
21: 1st electrode
22: 2nd electrode
21a, 22a: Finger portion
21b, 22b: Busbar portion
23: Photoelectric conversion unit
23a: Main surface of photoelectric conversion unit
30: Wiring member
31: Insulating substrate
32: Wiring
32a: 1st protruding portion
32b: 2nd protruding portion
40: Resin adhesive layer
50: Feed point

What is claimed is:

1. A solar module comprising:
   a plurality of solar cells having a photoelectric conversion unit and a first electrode and a second electrode provided on one main surface of the photoelectric conversion unit;
   a wiring member electrically connecting the first electrode of one solar cell to the second electrode of another solar cell adjacent to the one solar cell in one direction; and
   a resin adhesive layer bonding the wiring member and either the one solar cell or the other solar cell;
   the first electrode and the second electrode each having a plurality of finger portions extending in the one direction, and a busbar portion connected electrically to the plurality of finger portions and positioned in an end portion of the photoelectric conversion unit in the one direction;
   the first electrode and the second electrode each including plated film having a feed point positioned in the busbar portion; and
   the wiring member electrically connected to the first electrode or the second electrode in the finger portions.

2. The solar module according to claim 1, wherein the wiring member has a first protruding portion connected electrically to the finger portions of the first electrode of the one solar cell, and a second protruding portion connected electrically to the finger portions of the second electrode of the other solar cell and connected electrically to the first protruding portion;
   the wiring member provided over the busbar portion.

3. The solar module according to claim 1, wherein the busbar portion has a slender shape extending in another direction perpendicular to the one direction; and
   the feed point has a slender shape extending in the direction of busbar portion extension.

4. The solar module according to claim 1, wherein a plurality of feed points are provided at intervals to each other in the direction of busbar portion extension.

5. The solar module according to claim 1, wherein the surface layer of the first electrode and the second electrode is composed of plated film.

* * * * *

UNITED STATES PATENT AND TRADEMARK OFFICE
CERTIFICATE OF CORRECTION

| | | |
|---|---|---|
| PATENT NO. | : 9,166,088 B2 | Page 1 of 1 |
| APPLICATION NO. | : 14/182583 | |
| DATED | : October 20, 2015 | |
| INVENTOR(S) | : Yosuke Ishii et al. | |

It is certified that error appears in the above-identified patent and that said Letters Patent is hereby corrected as shown below:

PCT application information below needs to be added into bibliographic information of the title page of the Letters Patent;

Related U.S. Application Data
(63) Continuation of application No. PCT/JP2012/062125, filed on May 11, 2012.

Signed and Sealed this
Seventeenth Day of May, 2016

Michelle K. Lee
*Director of the United States Patent and Trademark Office*